US009900978B2

(12) United States Patent
Su et al.

(10) Patent No.: US 9,900,978 B2
(45) Date of Patent: Feb. 20, 2018

(54) PRINTED CIRCUIT BOARDS AND METHODS FOR MANUFACTURING SAME

(71) Applicants: Peking University Founder Group Co., Ltd., Beijing (CN); Chongqing Founder Hi-Tech Electronic Inc., Chongqing (CN); Zhuhai Founder PCB Development Co., Ltd., Zhuhai (CN)

(72) Inventors: Xinhong Su, Zhuhai (CN); George Dudnikov, Jr., Zhuhai (CN); Shuhan Shi, Zhuhai (CN)

(73) Assignees: Peking University Founder Group Co., Ltd., Beijing (CN); Zhuhai Founder PCB Development Co., Ltd., Zhuhai (CN); Chongqing Founder Hi-Tech Electronic Inc., Chongqing (CN)

(*) Notice: Subject to any disclaimer, the term of this patent is extended or adjusted under 35 U.S.C. 154(b) by 650 days.

(21) Appl. No.: 14/123,076

(22) PCT Filed: Oct. 29, 2012

(86) PCT No.: PCT/CN2012/083704
§ 371 (c)(1),
(2) Date: Mar. 20, 2014

(87) PCT Pub. No.: WO2013/097539
PCT Pub. Date: Jul. 4, 2013

(65) Prior Publication Data
US 2014/0190733 A1 Jul. 10, 2014

(30) Foreign Application Priority Data
Dec. 31, 2011 (CN) .......................... 2011 1 0460708

(51) Int. Cl.
H05K 1/02 (2006.01)
H05K 3/42 (2006.01)
H05K 1/11 (2006.01)

(52) U.S. Cl.
CPC ......... *H05K 1/0298* (2013.01); *H05K 1/0296* (2013.01); *H05K 3/429* (2013.01);
(Continued)

(58) Field of Classification Search
CPC ............ H05K 3/44; H05K 3/445; H05K 3/46; H05K 3/4602; H05K 3/4605; H05K 3/4611; H05K 3/4614; H05K 3/4823
See application file for complete search history.

(56) References Cited

U.S. PATENT DOCUMENTS 4,606,787 A * 8/1986 Pelligrino .............. H05K 3/205
156/150
4,642,160 A * 2/1987 Burgess ............... H05K 3/0035
216/18
(Continued)

FOREIGN PATENT DOCUMENTS

CN 1347276 A 5/2002
CN 101133478 A 2/2008
JP 6183421 A * 7/1994

OTHER PUBLICATIONS

International Search Report corresponding to International application No. PCT/CN2012/083704, dated Feb. 14, 2013, 4 pages.

*Primary Examiner* — Carl Arbes
(74) *Attorney, Agent, or Firm* — Lathrop Gage LLP

(57) ABSTRACT

Embodiments of the present application relate to the technical field of a printed circuit plate, in particular, to a printed circuit plate and a method manufacturing same so as to resolve a problem of an incomplete elimination of a short-line effect. The method for manufacturing a printed circuit board in the embodiments of the present application comprises a step of drilling target prepregs at positions corresponding to at least one preset hole therein so as to form through holes perforating through the target prepregs, wherein the formed through holes have an aperture greater (Continued)

than that of the preset hole, and the preset hole does not need to transmit electrical signal between layers of the PCB. The method further comprises: filling the formed through holes with a plating resist ink to prevent the through holes from being plated with a conductive material; laminating the target prepregs and core boards so as to form a multi-layer printed circuit board PCB, wherein some or all of the prepregs are the target prepregs; drilling the multi-layer PCB to perforate the preset holes in the target prepregs; and plating inner walls of holes formed by drilling the multi-layer PCB.

18 Claims, 13 Drawing Sheets

(52) U.S. Cl.
CPC .... *H05K 1/116* (2013.01); *H05K 2201/09645* (2013.01); *H05K 2201/09718* (2013.01); *Y10T 29/49165* (2015.01)

(56) References Cited

U.S. PATENT DOCUMENTS

| | | | | |
|---|---|---|---|---|
| 4,789,423 A | * | 12/1988 | Pelligrino | H05K 3/205 216/18 |
| 4,897,338 A | * | 1/1990 | Spicciati | H05K 3/4644 205/125 |
| 4,921,777 A | * | 5/1990 | Fraenkel | H05K 3/4644 205/125 |
| 5,377,404 A | * | 1/1995 | Berg | H05K 3/0082 29/703 |
| 5,436,062 A | * | 7/1995 | Schmidt | H05K 1/115 174/254 |
| 7,337,537 B1 | | 3/2008 | Smetana, Jr. | |
| 2002/0092677 A1 | | 7/2002 | Farquhar et al. | |
| 2002/0121334 A1 | | 9/2002 | Ikeda et al. | |
| 2005/0008868 A1 | | 1/2005 | Nakamura et al. | |
| 2006/0199390 A1 | * | 9/2006 | Dudnikov, Jr. | H05K 1/0257 438/700 |

* cited by examiner

PRINTED CIRCUIT BOARDS AND METHODS FOR MANUFACTURING SAME

CROSS REFERENCE TO RELATED APPLICATIONS

This patent document is a 35 USC § 371 National Stage application of International Application No. PCT/CN2012/083704 filed Oct. 29, 2012, which claims the benefit of priority to China Patent Application No. 201110460708.1 filed Dec. 31, 2011. The disclosure of each of the prior applications is considered part of and is incorporated by reference in the present patent document.

TECHNICAL FIELD

The present application relates to a technical field of a Printed Circuit Board (PCB) and a method for manufacturing the same.

BACKGROUND

The Printed Circuit Board (PCB) is a type of important electronic component, and, in general, used to achieve electrical connection among various electronic components. In the PCB with multi-layers, electrical signal is transmitted among various conductive layers of the PCB via a through hole disposed in the PCB. For example, the electrical signal may be transmitted between wirings on two conductive layers of the PCB via the through hole. As shown in FIG. 1, the PCB includes two core boards a1 and a2 and two prepregs b1 and b2, wherein core board a1 includes two conductive layers a11 and a13 and an insulating layer a12, and wherein core board a2 includes two conductive layers a21 and a23, and an insulating layer a22. The through hole c of the PCB has an inner wall plated with a conductive material c1, which can transmit the electrical signal between the wiring on the conductive layer a11 and the wiring on the conductive layer a13 of the PCB.

In a process of manufacturing the PCB, after lamination of the PCB, the through hole is formed by a high speed drilling tool at a preset position on the PCB. The through hole is then metalized, that is to say, the inner wall of the through hole is deposited with copper and then is plated, so that the electrical signal may be transmitted among various conductive layers. In some of those PCBs, however, the through hole is merely used to transmit the electrical signal between the wirings on some of the conductive layers. For example, in the PCB as shown in FIG. 1, the through hole c is merely used to transmit the electrical signal between the wiring on the conductive layer a11 and the wiring on the conductive layer a13, while portions of the through hole, which is throughout the prepregs b1 and b2 and the insulating layer a22, are not necessary for transmitting the electrical signal, and thus form a short line d (the short line refers to extra conductive materials in the through hole, which is not necessary for transmitting the electrical signal).

When the high speed electrical signal is transmitted via the through hole, it is easy to distort the electrical signal during transmission due to one or more short lines existing in the through hole in the PCB, which is called short-line effect. With the short-line effect, when the electrical signal is transmitted via the through hole, a part of the electrical signal will enter into one or more short lines of the through hole from a wiring connection on the conductive layer. This part of the electrical signal then may be reflected from an end of the short line to the wiring connection after a certain delay. This delayed reflection may make interference of the integrity of the electrical signal, and increase bit error rate of the electrical signal. In addition, attenuation of the electrical signal will increase as the length of the short line increases. As a result, in order to ensure the transmission of the electrical signal, the short-line effect should be eliminated.

Currently, in order to remove the short line of the through hole c in the PCB, the short line of the through hole is back drilled using a drilling tool in general. As shown in FIG. 2, a PCB which is back drilled to remove the short line d of FIG. 1 is shown. A back-drilled hole h is formed at the position corresponding to the short line d as shown in FIG. 1 after the back-drilling. Although a part of the short line is removed by back drilling, the short line cannot be removed completely since the drilling tool has a pointed tip. Then, parasitic capacitance, parasitic inductance and time delay affecting the integrity of the electrical signal cannot be eliminated completely, that is to say, the short-line effect cannot be eliminated completely. When the PCB is back drilled by using the drilling tool, it is necessary that the drilling tool must have relatively high accuracy. Since the accuracy of the drilling tool is not high, such as, the pointed tip of the drilling tool is too deep accidentally or off-center, it is easy to damage the functional portions (which function to transmit the electrical signal among different conductive layers) of the through hole while removing the short line, so that the PCB is scrapped. As a result, it causes a reduced yield but increased manufacturing cost for the PCB.

In view of the above, in the traditional method of removing the short line from the through hole in the PCB by a way of back-drilling, the short-line effect cannot be eliminated completely, and the PCB tends to be scrapped in the process. Consequently, it causes the reduced yield but increased manufacturing cost for the PCB.

SUMMARY

In embodiments of the present application, a printed circuit board and a method manufacturing same are provided to solve the problems of incompletely eliminated the short-line effect after drilling the PCB and the scrapped PCB easily caused during processes.

In an embodiment of the present application, a method for manufacturing a printed circuit board is provide, including:

drilling a target prepreg at a position corresponding to at least one preset hole therein so as to form a hole perforating through the target prepreg with an aperture greater than that of the preset hole, and the preset hole does not need to transmit electrical signal between layers;

filling the formed through hole with a plating resist ink to prevent the through holes from being plated with a conductive material;

laminating the target prepreg and core boards so as to form a multi-layer printed circuit board PCB, wherein some or all of the prepregs are the target prepregs;

drilling the multi-layer PCB to perforate the preset holes in the target prepregs; and plating inner walls of holes formed by drilling the multi-layer PCB.

When there are a plurality of target prepregs, before drilling the target prepregs, the method further comprises:

selecting, from all of the target prepregs, a target prepreg adjacent to a hole in the PCB, which needs to transmit the electrical signal between the layers, as a target prepreg that needs to be drilled.

The method in the embodiment of the present application, after filling the through hole with the plating resist ink but before the lamination process, further comprises:

curing the plating resist ink;

The method in the embodiment of the present application, before drilling the target prepregs, further comprises:

covering both top and bottom surfaces of the target prepreg with protective films which prevents the target prepreg from damage during the drilling process, respectively;

wherein after curing the plating resist but before the laminating process, the method further comprises:

removing the protective films from the top and bottom surfaces of the target prepreg.

Preferably, the protective film is a polyester film.

Preferably, the plating resist ink is an insulating and hydrophobic resin material.

Preferably, the insulating and hydrophobic resin material includes compounds consisting of one or more materials selected from silicon resin, polyethylene resin, fluorocarbon resin, polyurethane resin and acrylic resin.

Preferably, the drilling process includes a laser drilling, a mechanical drilling and a punching.

Preferably, the filling the through hole with the plating resist ink comprises:

filling the through hole with the plating resist by a way of cavity filling;

filling the through hole with the plating resist by a way of template printing; or filling the through hole with the plating resist by a way of screen printing.

In another embodiment of the present application, a printed circuit board is provided, comprising:

at least one target prepreg filled with a plating resist ink, wherein there is a hole ring perforating through the target prepreg at a position corresponding to a preset hole in the target prepreg, an inner hole of the hole ring is the preset hole, and the hole ring has an outer diameter equal to an aperture of the through hole, and is filled with the plating resist ink.

Preferably, the printed circuit board further comprises conductive layers, wherein, in a conductive layer of the conductive layers, which is adjacent to the target prepreg, there is conductive material at positions corresponding to the plating resist ink.

Preferably, the conductive layers are conductive layers adjacent to and on both sides of the target prepreg.

In the embodiments of the present application, the through holes are formed by drilling the target prepregs at the positions corresponding to the preset holes therein, and then the through holes are filled with the plating resist ink, so that the inner wall of the hole ring in the target prepreg will not be plated with the conductive material in the subsequent process of plating the hole formed by drilling the PCB. Then, the insulating portions that avoid the transmitting of the electrical signals are formed in the hole, as a result, the attenuation of the electrical signals is avoided, and the short-line effect is eliminated.

DETAILED DESCRIPTION

In the present application, a through hole is perforated by drilling at a position corresponding to a preset hole in a target prepreg (PP), and the through hole is filled with a plating resist ink so as to form an insulating portion, such that the problems that the short line effect in the PCB after the back drilling and scrapped PCB easily caused during the process may be resolved.

In an embodiment of the present application, a core board is a basic part constituting the PCB. A core board includes two conductive layers and an insulating layer therebetween. In general, the conductive layers included in the core board are copper foil. The prepreg is used as a bonding material among various cores and as an interlayer insulation. It is made of a material selected from FR-4, epoxy glass, polyimide glass, ceramic hydrocarbon, polyimide film, resin impregnated glass cloth, film, resin impregnated matte material, or Kevlar etc.

In general, there are two common ways to laminate the PCB. One way is foil-lamination. That is to say, the PCB is constituted of one or more cores, prepregs and foils, wherein the foils are disposed as outermost layers of the PCB. For example, in a PCB constituted of four layers, the cascading order is: a foil layer→a prepreg layer→a core→a prepreg layer→a foil layer. The other way is core-lamination. That is to say, the PCB is constituted of two or more cores, and a prepreg between two adjacent cores. For example, in a PCB constituted of four layers, the order of the sequential lamination is: a core layer→a prepreg→a core layer.

It should be noted that the prepreg is made of electronic-grade glass fabric impregnating resin. Before the lamination, the resin in the prepreg is at B-stage (unsteady-state stage). After the lamination, the resin in the prepreg is converted into C-stage (steady-state stage). During the lamination, the core and the foil are bonded together via the prepreg. As such, a plurality of conductive layers and a plurality of insulating layers are processed into an integral structure, which is a foundation to manufacture the multi-layer PCB. In addition, after the lamination, the prepreg has the same insulating function as the insulating layer of the core boards. As a result, the prepreg is also referred as an insulating layer after the lamination.

Hereafter, embodiments of the present application are further described in detail with reference to the accompanying drawings. In the embodiments of the present application, the method for manufacturing a PCB by core-lamination is taken as an example. The method for manufacturing a PCB by foil-lamination is similar to core-lamination, and thus will not be described repeatedly herein.

Figure 3:
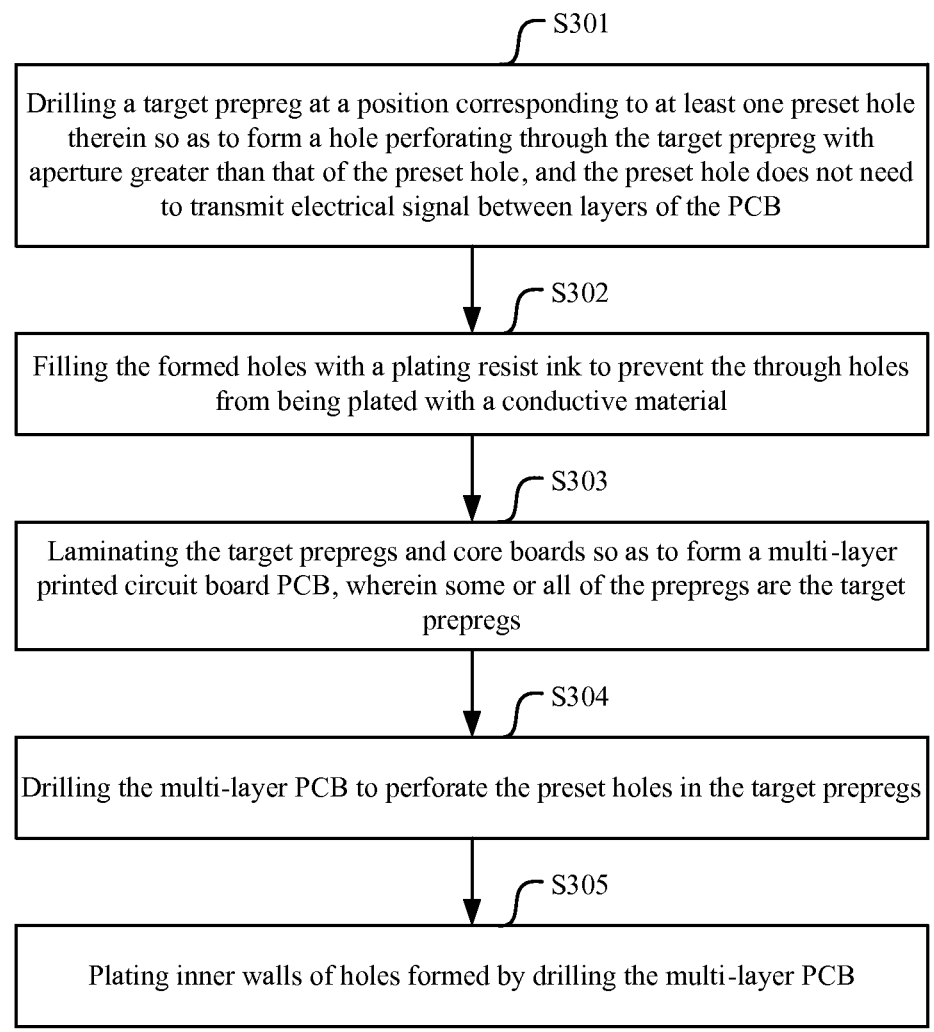
FIG. 3 is a flow chart showing a first method for manufacturing a first PCB according to an embodiment.

As shown in FIG. 3, in an embodiment of the present application, the method for manufacturing a PCB includes the following steps.

A step S301 of drilling the target prepreg at a position corresponding to at least one preset hole in the target prepreg to form a through hole perforating throughout the target prepreg, wherein an aperture of the hole is greater than that of the preset hole, and the preset hole does not need to transmit electrical signal;

A step S302 of filling the through holes with the plating resist ink to prevent the through holes from being plated with the conductive material;

A step S303 of laminating the prepregs and the core boards so as to form the multi-layer PCB, wherein some or all of the prepregs under the lamination are the target prepregs;

A step S304 of drilling the multi-layer PCB and perforating through the preset holes in the target prepregs; and A step S305 of plating inner walls of the preset holes formed by drilling the multi-layer PCB.

In general, the PCB includes a plurality of holes for transmitting different electrical signal between different conductive layers. Said holes may be through holes or blind holes. In the present embodiment, the PCB includes one hole for transmitting different electrical signal between different conductive layers, said hole is a through hole and a channel for electrical signal is transmitted between layers. Besides, the method for manufacturing a PCB including a plurality of holes for transmitting different electrical signals between different conductive layers is similar to the method for manufacturing a PCB including one of such holes, and the method for manufacturing a PCB including a plurality of channels for electrical signals transmitted between different conductive layers is similar to the method for manufacturing a PCB including one of such channels for electrical signals, so they are not described repeatedly herein. The instance of which the blind hole is used to transmit different electrical signals between conductive layers is similar to the instance of which the through hole is used, and thus this instance is not repeatedly described herein.

It should be noted that a plurality of holes in the PCB for transmitting different electrical signals between different conductive layers are holes formed by drilling after the lamination. However, positions of the holes have been determined during an early design period of the PCB.

The preset holes in the target prepreg at step S301 refer to the holes which do not need to transmit electrical signal between layers. That is to say, each of the preset holes is a portion of the hole for transmitting different electrical signals between different conductive layers, but does not need to transmit the electrical signals.

Figure 1:
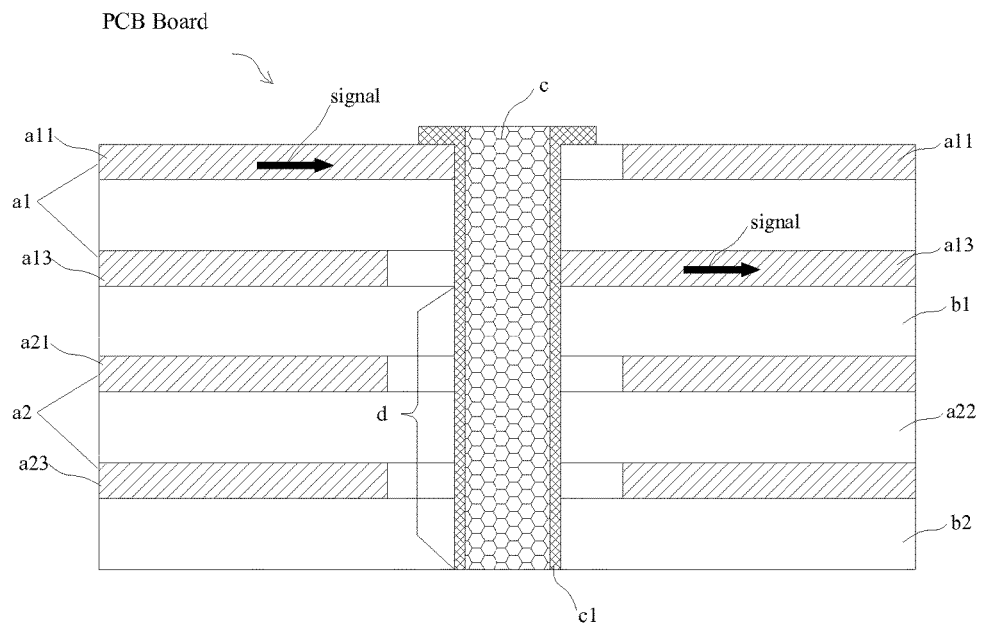
FIG. 1 is a schematic view showing a structure of a first PCB having un-eliminated short-line effect.
Figure 2:
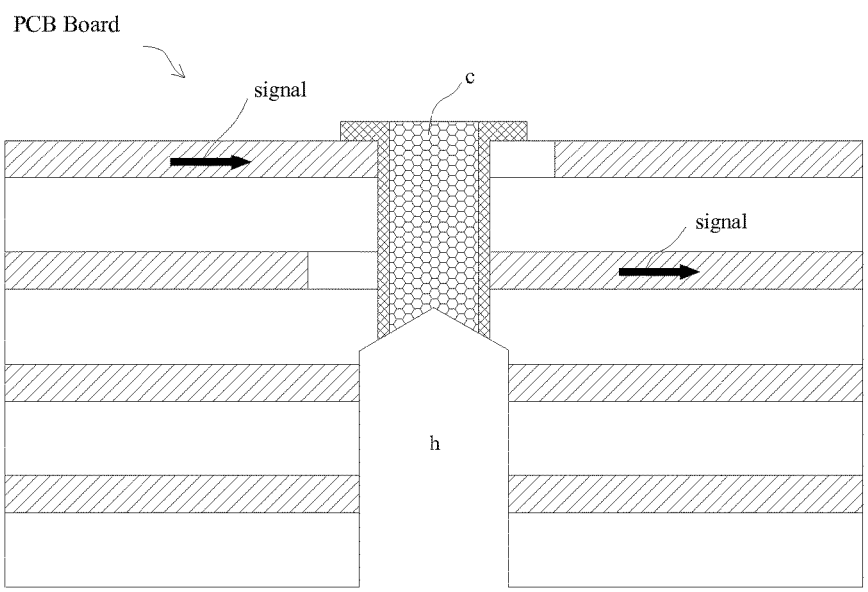
FIG. 2 is a schematic view showing a structure of a PCB after back drilled.

The target prepreg is where the portion of the hole, which does not need to transmit the electrical signal, is disposed. For example, in the PCB as shown in FIG. 1, only one channel for electrical signal is transmitted from the conductive layer a11 to the conductive layer a13 via the conductive material c1 on the inner wall of the through hole c. Thus, in the PCB, portions of the through hole c within the prepregs b1 and b2 do not need to transmit the electrical signal. Thus, the prepregs b1 and b2 are the target prepregs, the portion of the through hole c within the prepreg b1 is the preset hole in the target prepreg b1, and the portion of the through hole c within the prepreg b2 is the preset hole in the target prepreg b2.

Figure 4A:
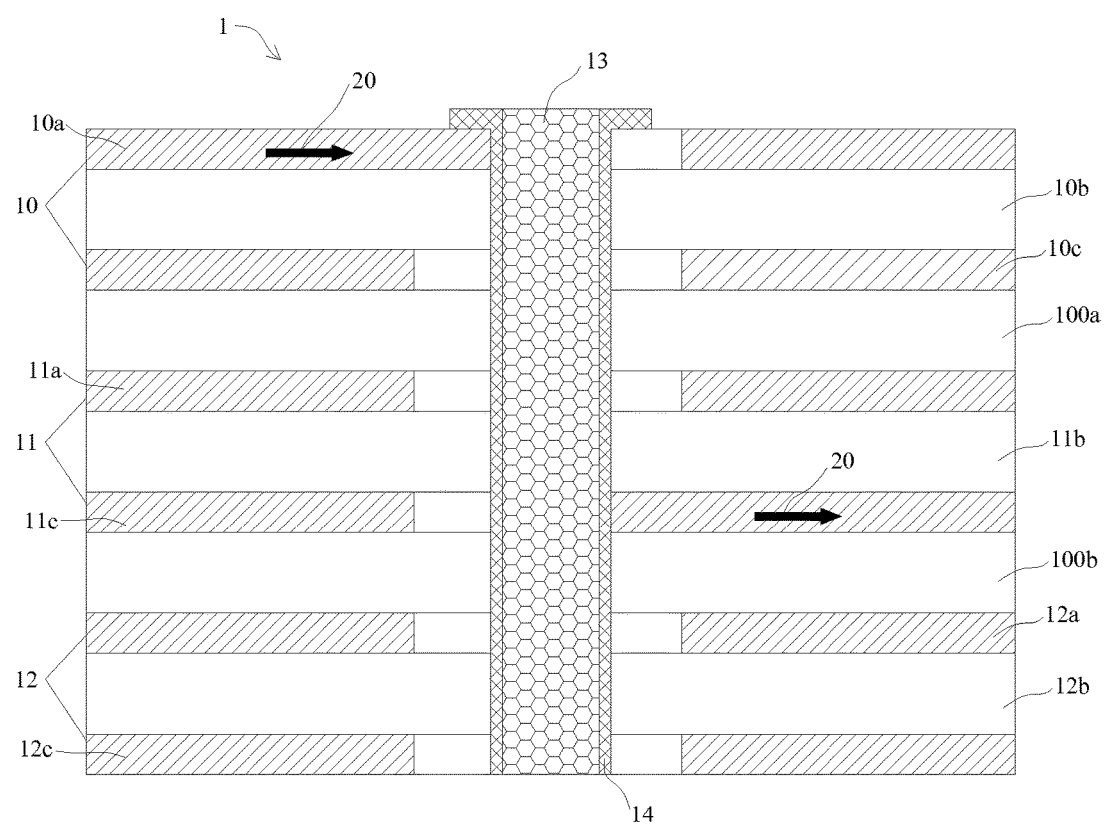
FIG. 4A is a schematic view showing a structure of a second PCB having un-eliminated short-line effect.

As another example, the PCB 1 as shown in FIG. 4A includes three core boards 10, 11 and 12, and two prepregs 100a and 100b, wherein the core board 10 includes conductive layers 10a and 10c and an insulating layer 10b, the core board 11 includes conductive layers 11a and 11c and an insulating layer 11b, and the core board 12 includes conductive layers 12a and 12c and an insulating layer 12b. The PCB 1 includes one through hole 13 deposited and plated with conductive material 14. The PCB 1 includes one channel for electrical signal 20 transmitted from the conductive 10a to the conductive 11c via the conductive material 14 on the inner wall of the through hole 13. In the PCB 1, portion of the through hole 13 which is within the prepreg 100a needs to transmit the electrical signal 20, while portion of the through hole 13 which involved by the prepreg 100b does not need to transmit the electrical signal 20. Thus, it is determined that the prepreg 100b is the target prepreg, and portion of the through hole 13 within the target prepreg 100b is the preset hole within the target prepreg 100b.

Figure 4B:
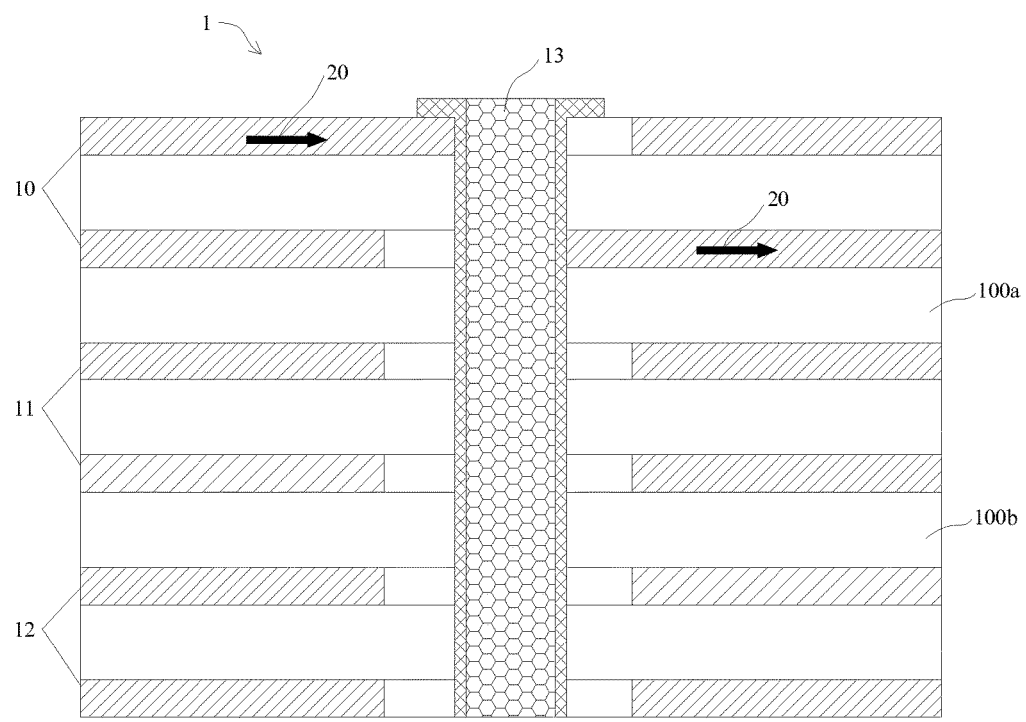
FIG. 4B is a schematic view showing a structure of a third PCB having un-eliminated short-line effect.

As further shown in FIG. 4B, the PCB 1 includes three core boards 10, 11 and 12, and two prepregs 100a and 100b. Since both portions of the through hole 13 involved by the prepregs 100a and 100b do not need to transmit the electrical signal, it is determined that the prepregs 100a and 100b are the target prepregs. And the portion of the through hole 13 within the prepreg 100a is the preset hole within the target prepreg 100a, and that the portion of the through hole 13 within the target prepreg 100b is the preset hole within the target prepreg 100b.

At step S301, a hole throughout the target prepreg is drilled at a position corresponding to the preset hole, with an aperture greater than that of the preset hole.

In particular, if the PCB includes only one target prepreg, a hole is formed by drilling at a position corresponding to the preset hole in the target prepreg.

If the PCB includes a plurality of target prepregs, holes are formed by drilling the target prepregs at positions corresponding to the preset holes in at least one of the plurality of target prepregs.

In particular, the holes may be formed by drilling the target prepregs at positions corresponding to the preset holes in one or more or all of the target prepregs. For example, in the PCB 1 shown in FIG. 4B including two target prepregs 100a and 100b, the holes may be formed by drilling the target prepreg 100a the at a position corresponding to the preset hole in the target prepreg 100a and by drilling the target prepregs 100b at a position corresponding to the preset hole in the target prepreg 100b, or by drilling the prepregs 100a and 100b at positions corresponding to the preset holes therein, respectively.

Preferably, when there is a plurality of target prepregs, before the drilling, the target prepregs adjacent to holes that need to transmit the electrical signal between layers in the PCB are selected from all of the target prepregs as the target prepregs to be drilled.

In particular, when there is a plurality of target prepregs, it is necessary to drill only the targets prepreg adjacent to the hole for transmitting the electrical signal between layers and to fill them with the plating resist ink, so as to achieve the effects of eliminating the short-line effect and preventing the electrical signal from attenuating without processing all of the target prepregs. As a result, the efficiency of processing the target prepregs is improved and the time for manufacturing the PCB is reduced while eliminating the short-line effect and preventing the electrical signal from attenuating.

With respect to the PCB 1 as shown in FIG. 4B, a portion of the through hole 13, which is used to transmit the electrical signal between layers, is located within the core board 10. In addition, only the target prepreg 100a is adjacent to the portion of the through hole 13, which is located within the core board 10. Thus, a position corresponding to the preset hole in the target prepreg 100a is selected to be drilled so as to form a hole perforating throughout the selected target prepreg 100a and with an aperture greater than that the preset hole.

Figure 4C:
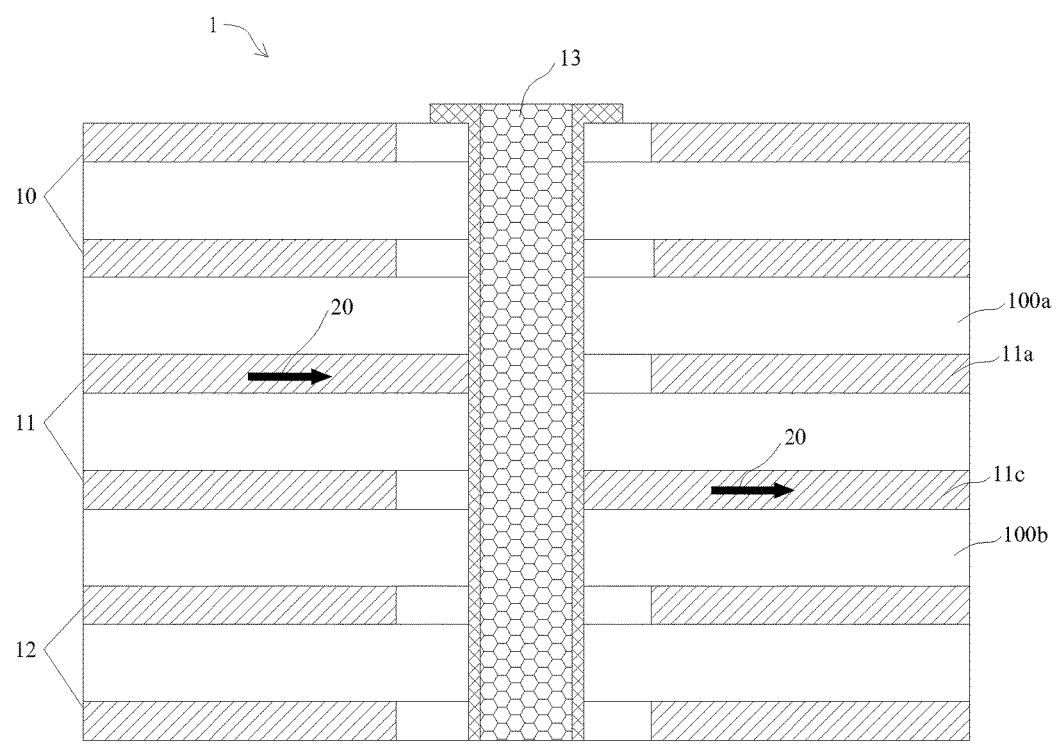
FIG. 4C is a schematic view showing a structure of a fourth PCB having un-eliminated short-line effect.

For another example, in the PCB 1 as shown in FIG. 4C, if the electrical signal 20 is transmitted from the conductive layer 11a to the conductive layer 11c of the core board 11, a portion of the through hole 13, which needs to transmit the electrical signal between the layers, is only a portion of the through hole 13, which is located within the core board 11. And portions of the through hole 13, which are not necessary to be used to transmit the electrical signal between the layers include:

a portion of the through hole 13, which is located within the core board 10, a portion of the through hole 13, which is located within the target prepreg 100a, a portion of the through hole 13, which is located within the target prepreg 100b and a portion of the through hole 13, which is located within the core board 12.

As a result, the target prepregs adjacent to the portion of the through hole 13, which is used to transmit the electrical signal between layers, are the target prepreg 100a and the target prepreg 100b.

Accordingly, if a position corresponding to the preset hole in the target prepreg 100a is only selected to be drilled and filled with the plating resist ink, after the lamination, the electrical signal 20 cannot be prevented from transmitting through the portions of the through hole 13 within the target prepreg 100b and the core board 12, which causes the partial attenuation of the electrical signal 20 so that the short-line effect cannot be eliminated completely. Alternatively, when a position corresponding to the preset hole in the target prepreg 100b is only selected to be drilled, which causes the partial attenuation of the electrical signal 20 so that the short-line effect cannot be eliminated completely. Preferably, positions corresponding to the preset holes in the target prepreg 100a and the target pregpreg 100b are drilled, respectively, so that the attenuation of the electrical signal is avoided, and thus the short-line effect is eliminated completely.

The drilling process at step S301 can be achieved by laser drilling, machine drilling or punching as required.

In order to prevent the target prepreg from damage (including wearing, deformation etc.) during the drilling process, both top and bottom surfaces of the target prepreg is covered with a layer of protective film, respectively, before the drilling process.

Preferably, the protective film is a polyester film, which has good thermal resistance, surface smoothness, transparency and mechanical flexibility.

Accordingly, before lamination, after the plating resist ink is filed the method further includes removing the protective films from the top and bottom surfaces of the target prepreg.

The plating resist ink used at step S302 is an insulating and hydrophobic resin material.

Preferably, the insulating and hydrophobic resin material includes compound consisting of one or more materials selected from silicon resin, polyethylene resin, fluorocarbon resin, polyurethane resin and acrylic resin.

Further, the compound consists of one or more materials selected from silicon resin, polyethylene resin, fluorocarbon resin, polyurethane resin and acrylic resin may be an ointment or viscous liquid.

Filling the hole with the plating resist at step S302 includes, but not limits to:

filling the through hole with the plating resist by way of cavity filling;

filling the through hole with the plating resist by way of template printing; or filling the through hole with the plating resist by way of screen printing.

At step S303, the prepregs and the core boards are laminated so as to form the multi-layer PCB, wherein some or all the prepregs after the lamination are the target prepregs.

Figure 5A:
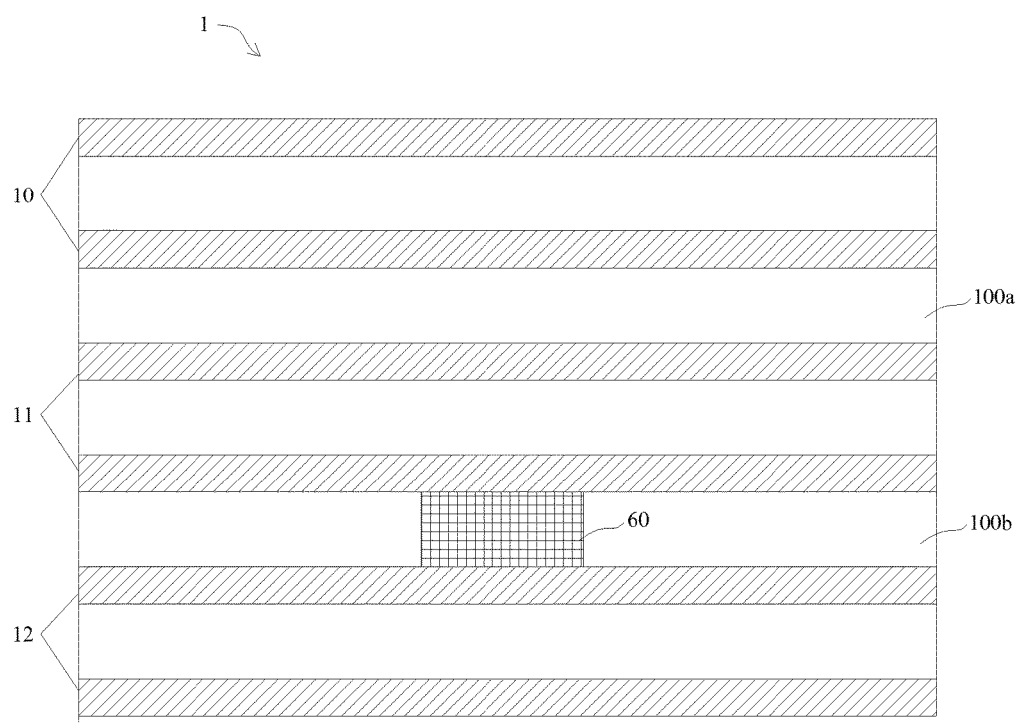
FIGS. 5A to 5C are schematic views showing structures of the first PCB while being manufactured according to the first method.

In particular, taking the PCB 1 as shown in FIG. 4B as an example, the prepreg filled with the plating resist ink 60 is the target prepreg 100b, while the prepreg that is not filled with the plating resist ink 60 is the prepreg 100a. As a result, all the prepregs 100a and 100b and the core boards 10 to 12 are laminated according to requirements on manufacturing the PCB 1 so as to form the multi-layer PCB, as shown in FIG. 5A.

At step S304, the multi-layer PCB formed at step S303 is drilled and the preset hole in the target prepreg is formed.

In particular, after drilling the multi-layer PCB, a through hole is formed throughout the multi-layer PCB. The through hole extends through the preset hole, with an inner diameter equal to that of the preset hole of the prepreg. Taking the PCB 1 as shown in FIG. 5A as an example, when the PCB 1 is drilled to form a through hole, the through hole 13 is formed to extend through the core boards 10 to 12, the prepreg 100a and the target prepreg 100b, and the hole of the target prepreg 100b filled with the plating resist ink 60 is drilled through to form the preset hole, as shown in FIG. 5B.

At step S305, the inner wall of the hole formed by drilling the multi-layer PCB is plated.

In particular, the inner wall of the hole formed at step S304 is deposited with copper and plated. After the plating process, the inner wall of the hole with the plating resist ink hasn't been plated with the conductive material and thus form an insulating portion. In contrast, the inner wall of the hole without the plating resist ink will be plated with the productive material and thus form a conductive portion. Consequently, the electrical signal is transmitted between layers via the conductive portion of the hole.

Figure 5B:
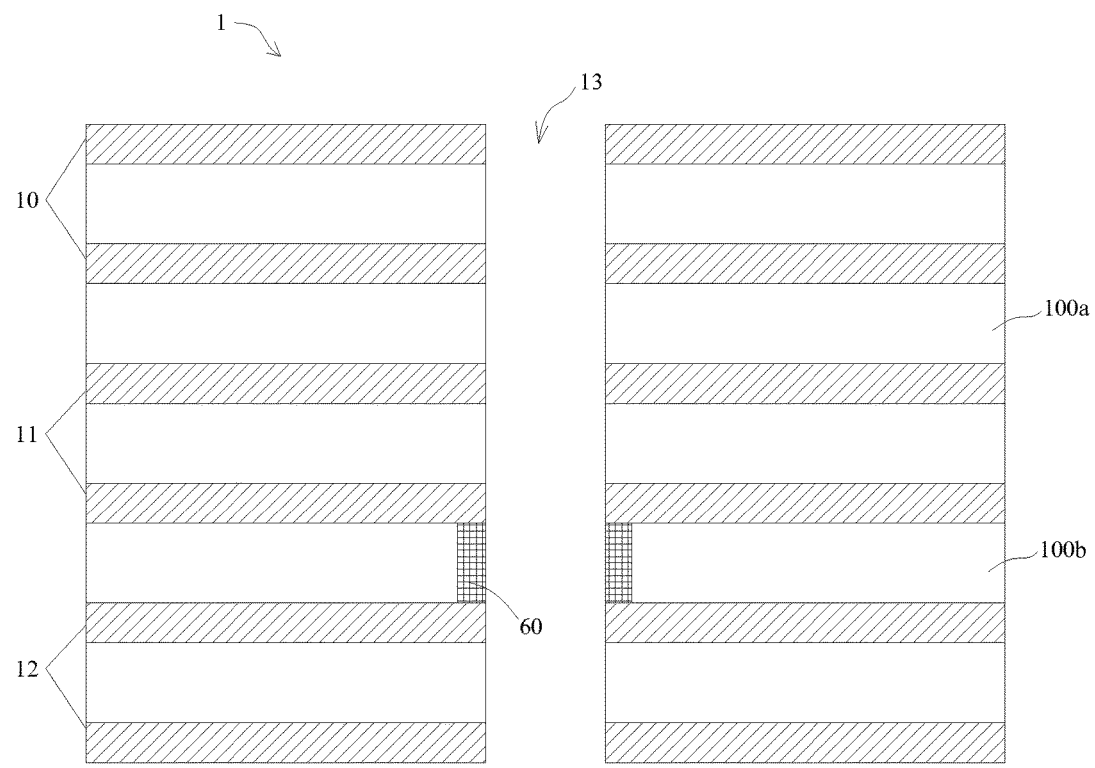
Figure 5C:
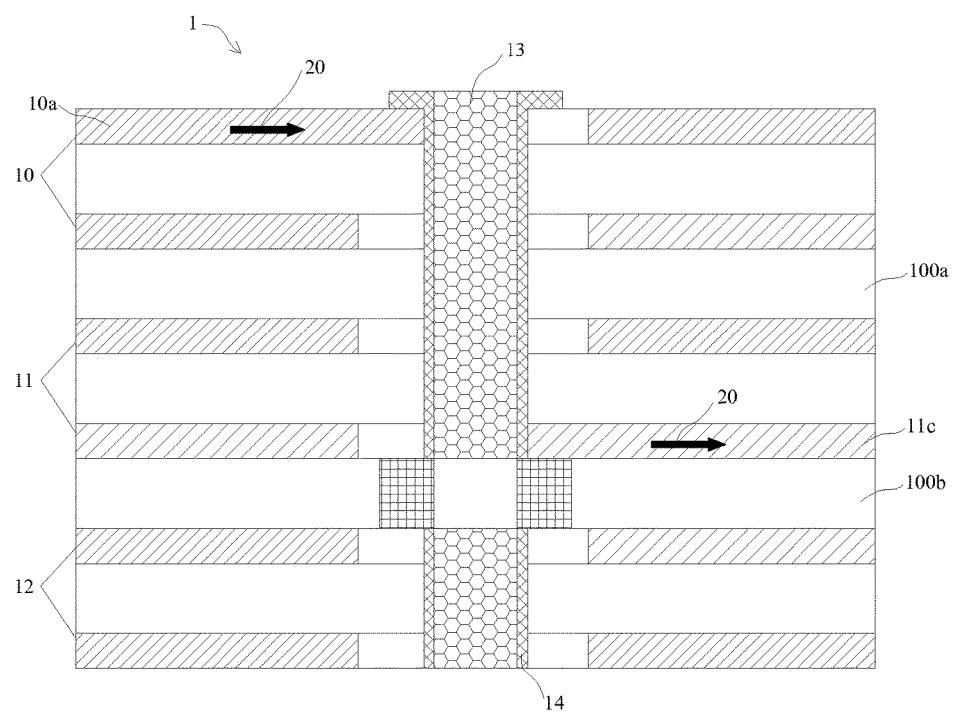

Taking the PCB as shown in FIG. 5B as an example, after the through hole 13 of the PCB 1 is deposited with copper and then plated, the inner wall of the through hole 13 without the plating resist ink is plated with the conductive material 14 so as to form the conductive portion, such as, portions of the through hole 13 within the core board 10, within the prepreg 100a, within the core boards 11 and 12. In addition, the inner wall of the through hole 13 with the plating resist ink 60 hasn't been plated with the conductive material 14 so as to form the insulating portion, such as, the preset hole within the target prepreg 100b. As shown in FIG. 5C, the electrical signal 20 can only be transmitted between the wiring of the conductive layer 10a and the wiring of the conductive layer 11c via the conductive portions of the through hole 13 within the core board 10, the prepreg 100a and the core board 11, while being isolated from the insulating portions of the through hole 13 within the prepreg 100b and the conductive portions of the through hole 13 within the core board 11. As a result, not only the short-line effect is eliminated but also the attenuation of the electrical signal 20 is avoided, so that the integrity of the electrical signal is ensured.

Figure 6:
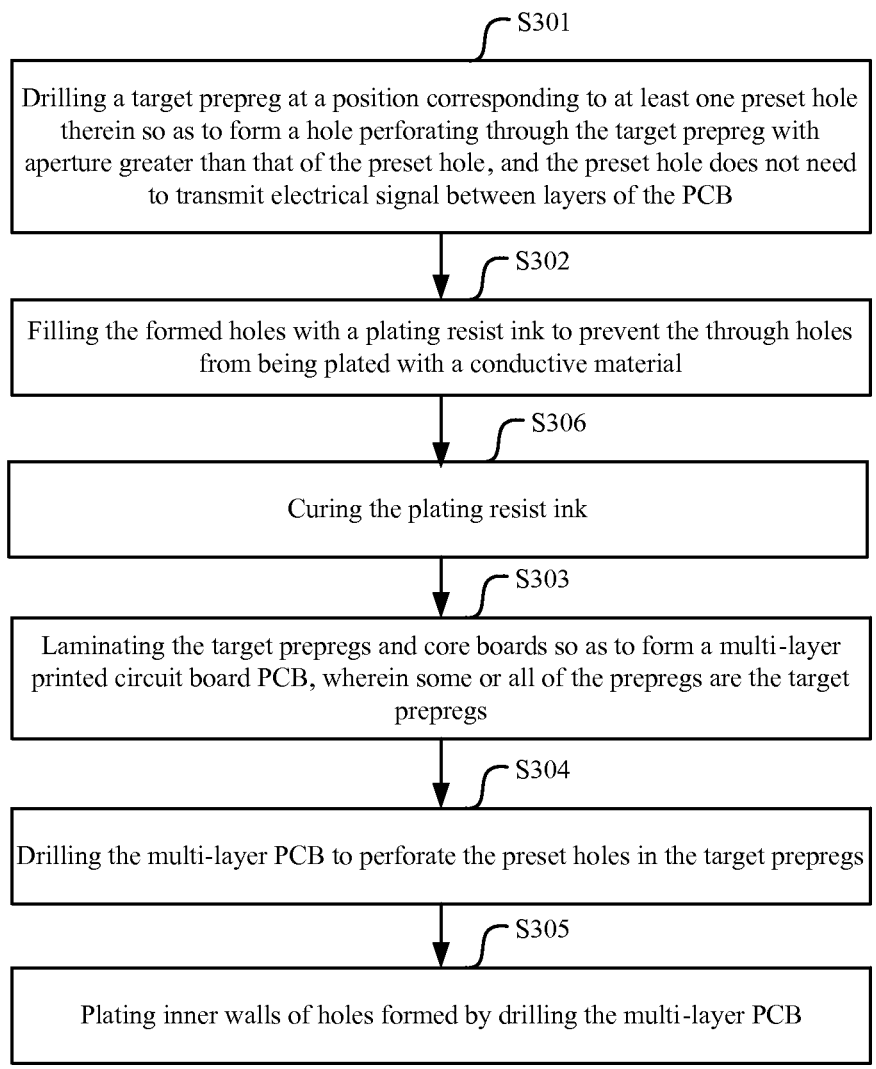
FIG. 6 is a flow chart showing a second method for manufacturing a PCB according to an embodiment of the present application.

After step S302 but before step S303, the method for manufacturing the PCB according the embodiment of the present application, as shown in FIG. 6, further comprises:

at step S306, curing the plating resist ink.

Figure 7:
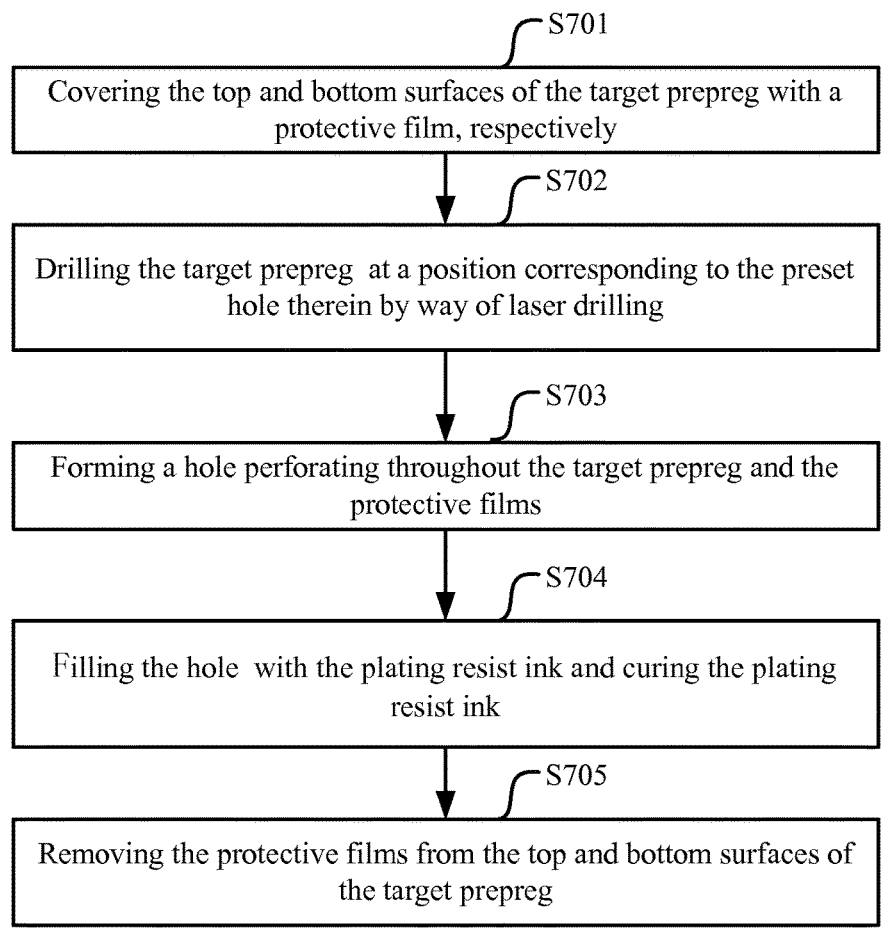
FIG. 7 is a flow chart showing a method for manufacturing a target prepreg filled with a plating resist.
Figure 8A:
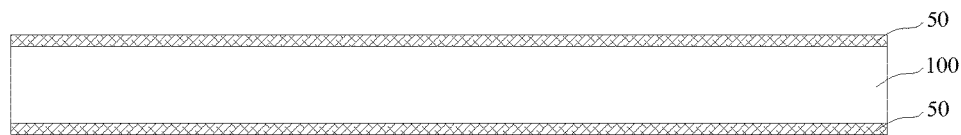
FIGS. 8A to 8E are schematic views showing structures of the target prepreg filled with the plating resist during the manufacturing process according to embodiments of the present application.
Figure 8B:
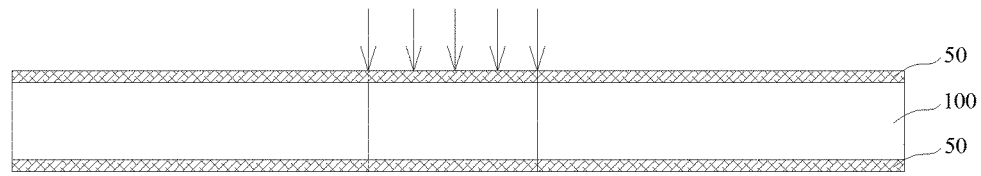
Figure 8C:
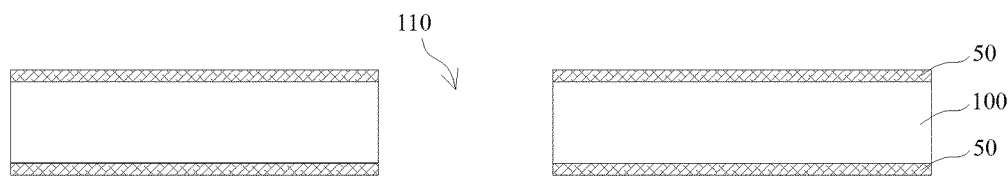
Figure 8D:
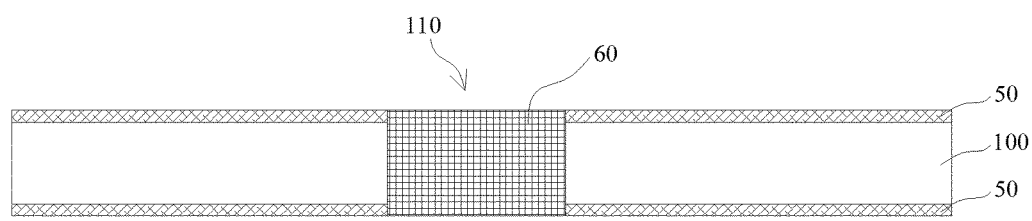
Figure 8E:
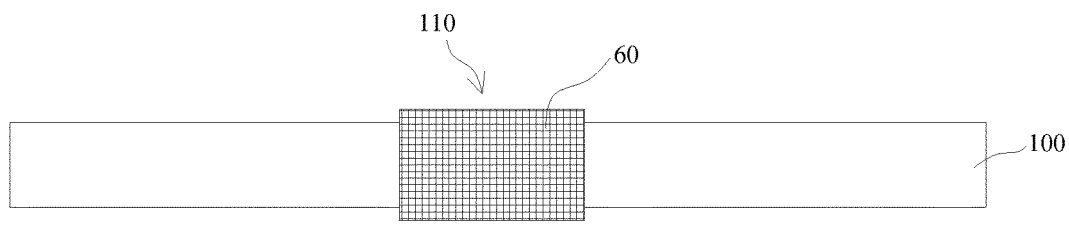

Hereafter, taking laser drilling as an example, a method for processing a target prepreg selected for drilling is described in detail, as shown in FIG. 7, comprising:

a step S701 of covering the top and bottom surfaces of the target prepreg 100 with a protective film 50, respectively, as shown in FIG. 8A;

a step S702 of drilling the target prepreg 100 at a position corresponding to the preset hole therein by way of laser drilling, as shown in FIG. 8B;

a step S703 of forming a hole 110 perforating throughout the target prepreg 100 and the protective films 50, as shown in FIG. 8C, which is carried out after the drilling;

a step S704 of filling the hole 110 with the plating resist ink 60 and curing the plating resist ink 60, as shown in FIG. 8D; and a step S705 of removing the protective films 50 from the top and bottom surfaces of the target prepreg 100, as shown in FIG. 8E.

According to an embodiment of the present application, a PCB manufactured according to the method described in the above embodiments of the present application is provided. The PCB includes at least one target prepreg filled with the plating resist ink. The PCB includes a hole ring perforating through the target prepreg at a position corresponding to a preset hole in the target prepreg. The hole ring has an inner hole as the preset hole. The hole ring has an outer diameter equal to that of the through hole. In addition, the hole ring is filled with the plating resist ink.

Figure 9:
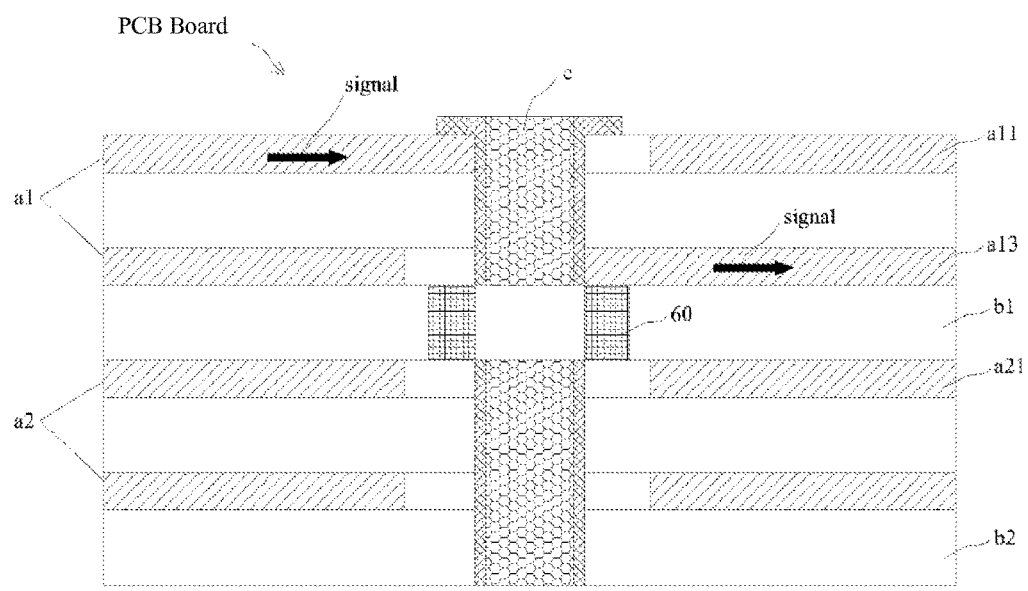
FIG. 9 is a schematic view showing a structure of a first PCB manufactured by the method according to the embodiment of the present application.

Taking the PCB as shown in FIG. 1 as an example, a PCB manufactured by way according to an embodiment of the present application is shown in FIG. 9. The target prepreg b1 is selected to be filled with the plating resist ink 60, while the target prepreg b2 is selected not to be filled with the plating resist ink 60. Due to the insulating portion of the target prepreg b1, the electrical signal is only transmit from the conductive layer a11 to the conductive layer a13 via the conductive portion of the through hole c within the core board a1, being isolated from the insulating portion of the through hole c within the target prepreg b1, the conductive portion of the throughout c within the core board a2, and the conductive portion of the through hole c within the prepreg b2. Accordingly, the short-line effect is eliminated and thus the attenuation of the electrical signal is avoided.

Preferably, the PCB further includes conductive layers, wherein conductive material is left at position on the conductive layer adjacent to the target prepreg filled with the plating resist ink, the position corresponding to that of the plating resist ink.

Preferably, the conductive layers that are adjacent to the target prepreg filled with the plating resist ink refer to conductive layers adjacent to and on both sides of the target prepreg.

As shown in FIG. 9, the hole ring in the target prepreg b1 of the PCB is filled with the plating resist ink. The conductive layers adjacent to the target prepreg b1 refer to the conductive layer a13 of the core board a1 and the conductive layer a21 of the core board a2. In addition, portions of the through hole c, which are within the conductive layer a13 and the conductive layer a21, have inner walls filled with the conductive material.

In the PCB according to the above embodiment of the present application, in the conductive layers adjacent to and on both sides of the target prepreg filed with the plating resist ink, the inner walls of the holes at the positions corresponding to that of the inner hole (namely, the preset hole) of the hole ring is filled with the conductive material. For target prepreg b1 as shown in FIG. 9, the conductive layers adjacent to and on both sides the target prepreg b1 are the conductive layer a13 of the core board a1 and the conductive layer a21 of the core board a2.

Figure 10:
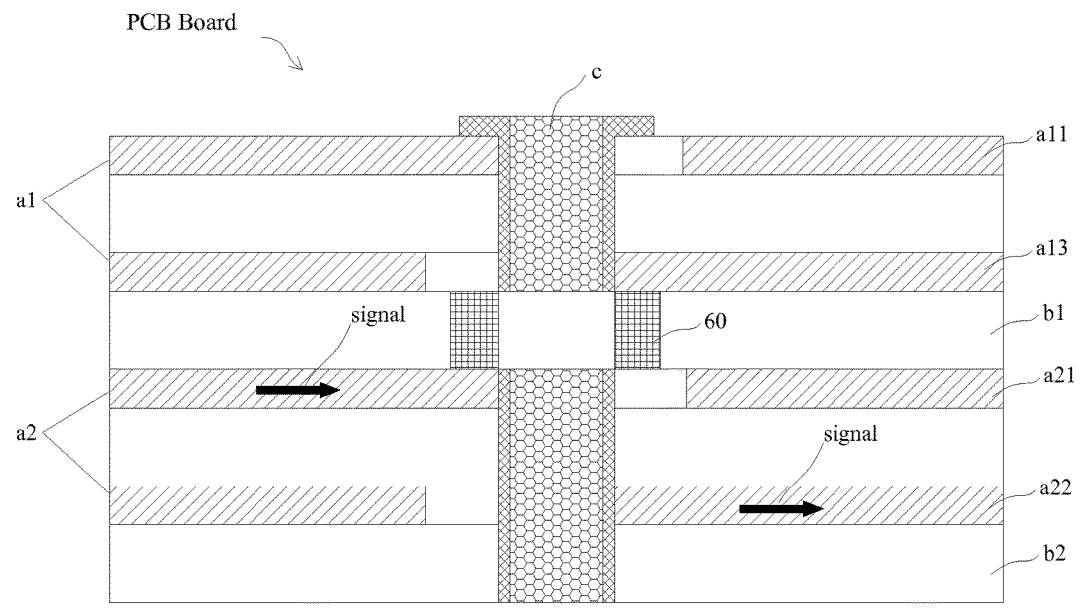
FIG. 10 is a schematic view showing a structure of a second PCB manufactured by the method according to the embodiment of the present application.

The conductive material (such as, copper sheet) at positions on the conductive layers a13 and a21, wherein the positions correspond to those of the plating resist ink in the hole ring of the target pregpreg b1, such that the electrical signals can be transmitted from the conductive layer a11 to the conductive layer a13 via the through hole c, as shown in FIG. 9. Meanwhile, the electrical signal can be transmitted from the conductive layer a21 to the conductive a22 via the through hole c, as shown in FIG. 10.

The positions on the conductive layers a13 and a21 corresponding to that of the plating resist ink in the hole ring in the target prepreg b1 refer to such positions on the conductive layer a13 and a21 that contact with the plating resist ink 60 in the hole ring in the target prepreg b1.

Figure 11:
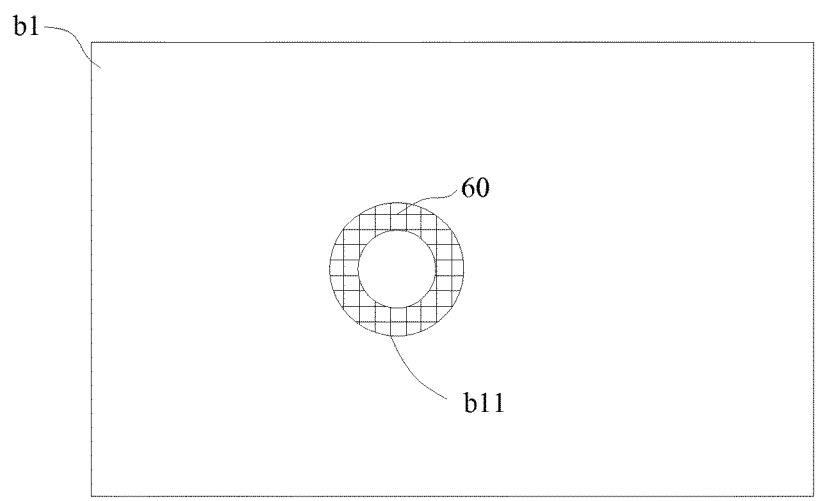
FIG. 11 is a plan view showing the target prepreg filled with the plating resist.

The target prepreg b1 in FIG. 11 is shown in FIG. 9 as a top view. The target prepreg b1 includes a hole ring b11 perforating through the target prepreg b1 at the position corresponding to the preset hole in the target prepreg b1. The hole ring b11 has an inner hole as the preset hole. The hole ring b11 has an outer diameter equal to that of the through hole. In addition, the hole ring b2 is filled with the plating resist ink 60.

It should be noted that the case where the PCB includes a channel for transmitting electrical signals between different conductive layers is taken as an example to illustrate the embodiments of the present application. When the PCB includes a plurality of channels for transmitting electrical signals, the PCB manufactured by way of the embodiments of the present application not only eliminates the short-line effect but also avoids interference between various channels of electrical signal, so the integrity of each channel of electrical signal is ensured.

According to the embodiments of the present application, the hole ring in the target prepreg is filled with the plating resist ink so that the portion of the through hole at the preset hole forms the insulating portion, which ensured that the PCB after the laminating process has smooth surface. Since the target prepreg has a thickness enough for effectively preventing the electrical signal from transmitting through the insulating portion, the attenuation of the electrical signals would be effectively avoided.

Although the present application is described with reference to preferable embodiments, once those skilled in the art learn basic inventive concept, they can make modifications and variants to these embodiments. Therefore, the appended claims are intended to be explained as including the preferable embodiments together with all modifications and variants falling within the script and scope of the present invention.

In the embodiments of the present application, the through holes are formed by drilling at the position corresponding to the preset hole in the target prepreg, and the through hole is filled with the plating resist ink, so that the inner wall of the hole ring in the target prepreg will not be plated with the conductive material in the subsequent process of plating the hole formed by drilling the PCB. As a result, the insulating portion for not transmitting the electrical signal is formed in the hole ring, so the attenuation of the electrical signal is avoided and the short-line effect is eliminated.

It is apparent to those skilled in the art to make various modifications and variants to the present application without departing from the sprit and scope of the present invention. As such, if these modifications and variants belong to the scope of the present invention and equivalents thereof, these modifications and variants are contained in the present invention.

The invention claimed is:

1. A method for manufacturing a printed circuit board (PCB), comprising:
   drilling a single insulating target prepreg at a position corresponding to at least one preset hole therein so as to form the preset hole perforating through the single insulating target prepreg with an aperture greater than that of the preset hole, wherein the preset hole does not need to transmit electrical signal between layers of the PCB;
   filling the formed preset hole with a plating resist material over a whole thickness of the single insulating target prepreg so as to prevent the preset hole from being plated with conductive material;
   laminating the single insulating target prepreg and a core board comprising two conductive layers and an insulating layer therebetween, so as to form a multi-layer printed circuit board (PCB), wherein the single insulating target prepreg is used as a bonding material and an interlayer insulation among various core boards;
   drilling the multi-layer PCB to perforate a through hole in the multi-layer PCB, wherein the perforated through hole goes through the preset hole; and
   plating an inner wall of the through hole formed by said drilling of the multi-layer PCB, without plating an inner wall of the preset hole due to the presence of the plating resist material.

2. The method as claimed in claim 1, wherein the drilling process comprises a laser drilling, a mechanical drilling and a punching.

3. The method as claimed in claim 1, wherein the filling the preset hole with the plating resist material comprises:
   filling the preset hole with the plating resist material by a way of cavity filling;
   filling the preset hole with the plating resist material by a way of template printing; or
   filling the preset hole with the plating resist material by a way of screen printing.

4. The method as claimed in claim 1, wherein, there are a plurality of insulating target prepregs, and
   wherein, before drilling the insulating target prepregs, the method further comprises:
   selecting, from the insulating target prepregs, an insulating target prepreg adjacent to a conductive layer of the core board that is used to transmit the electrical signal between the layers, as a single insulating target prepreg to be drilled.

5. The method as claimed in claim 4, wherein after filling the preset hole with the plating resist material but before the lamination process, the method further comprises:
   curing the plating resist material.

6. The method as claimed in claim 4, wherein the drilling process comprises a laser drilling, a mechanical drilling and a punching.

7. The method as claimed in claim 4, wherein the filling the preset hole with the plating resist material comprises:
   filling the preset hole with the plating resist material by a way of cavity filling;
   filling the preset hole with the plating resist material by a way of template printing; or
   filling the preset hole with the plating resist material by a way of screen printing.

8. The method as claimed in claim 1, wherein after filling the preset hole with the plating resist material but before the lamination process, the method further comprises:
   curing the plating resist material.

9. The method as claimed in claim 8, wherein before drilling the insulating target prepregs, the method further comprises:
   covering top and bottom surfaces of the insulating target prepreg with protective films to prevent the insulating target prepreg from damage during the drilling process, respectively.

10. The method as claimed in claim 9, wherein the protective film is a polyester film.

11. The method as claimed in claim 8, wherein after curing the plating resist material but before the laminating process, the method further comprises:
    removing the protective films from the top and bottom surfaces of the single insulating target prepreg.

12. The method as claimed in claim 9, wherein the drilling process comprises a laser drilling, a mechanical drilling and a punching.

13. The method as claimed in claim 9, wherein the filling the preset hole with the plating resist material comprises:
    filling the preset hole with the plating resist material by a way of cavity filling;
    filling the preset hole with the plating resist material by a way of template printing; or
    filling the preset hole with the plating resist material by a way of screen printing.

14. The method as claimed in claim 1, wherein the plating resist material is an insulating and hydrophobic resin material.

15. The method as claimed in claim 14, wherein the insulating and hydrophobic resin material includes compounds consisting of one or more materials selected from silicon resin, polyethylene resin, fluorocarbon resin, polyurethane resin and acrylic resin.

16. A printed circuit board, comprising:
    a single insulating target prepreg filled with a plating resist material to form a hole ring over a whole thickness of the single insulating target prepreg,
    wherein the single insulating target prepreg is used as a bonding material and an interlayer insulation among various core boards each comprising two conductive layers and an insulating layer therebetween, the hole ring is perforated through the single insulating target prepreg at a position corresponding to a through hole in the printed circuit board, the through hole goes through the hole ring,
    the through hole is configured as an inner hole of the hole ring, and the hole ring has an outer diameter equal to an aperture of a preset hole in the single insulating target prepreg, and is filled with the plating resist material for preventing from being plated with a conductive material.

17. The printed circuit board as claimed in claim 16, wherein the printed circuit board further comprises conductive layers;

wherein, in a conductive layer of the conductive layers, which is adjacent to the single insulating target prepreg, there is conductive material at positions corresponding to the plating resist material.

18. The printed circuit board as claimed in claim 17, wherein the conductive layers are adjacent to two sides of the single insulating target prepreg.

\* \* \* \* \*